United States Patent [19]

Kent

[11] Patent Number: 4,858,820
[45] Date of Patent: Aug. 22, 1989

[54] DESOLDERING AID AND METHOD

[75] Inventor: George M. Kent, Sierra Madre, Calif.

[73] Assignee: Plato Products, Inc., Glendora, Calif.

[21] Appl. No.: 15,881

[22] Filed: Feb. 18, 1987

[51] Int. Cl.[4] ............................................. B23K 29/00
[52] U.S. Cl. .................................... 228/264; 228/19; 228/51
[58] Field of Search .................... 228/264, 19, 20, 51, 228/59

[56] References Cited

U.S. PATENT DOCUMENTS

| | | | |
|---|---|---|---|
| 1,676,298 | 7/1928 | Steiglitz | 220/62 |
| 3,813,023 | 5/1974 | Auray et al. | 228/19 |
| 4,366,925 | 1/1983 | Fanene | 228/20 |
| 4,436,242 | 3/1984 | Shisler et al. | 228/264 |
| 4,528,746 | 7/1985 | Yoshimura | 228/264 |
| 4,561,586 | 1/1985 | Abel et al. | 228/264 |
| 4,564,135 | 1/1986 | Barrese et al. | 228/20 |

FOREIGN PATENT DOCUMENTS 6406693  1/1965  Netherlands ........................ 220/62

OTHER PUBLICATIONS

IBM Technical Disclosure, Solder Removal Tool, Backes, vol. 23, No. 9, 1981.
IBM Technical Disclosure Component Removal Tool, Baron, vol. 20, No. 8, 1978.
Plato Products brochure, "Surface Mounted Device Soldering/Desoldering Tips" 1985.
UPC Corporation brochure, "Temperature Controlled Soldering," 1985.
Hexacon Electric Co. brochure, "SMD Slotted Spade & Tunnel Tips, to Fit Hexacon Soldering Irons," 1985.

Primary Examiner—Richard K. Seidel
Assistant Examiner—Karen Skillman
Attorney, Agent, or Firm—Christie, Parker & Hale

[57] ABSTRACT

A technique is provided for desoldering circuit components employing a desoldering aid that fits like a cap on a standard size rectangular circuit component. The aid has a rectangular top of high thermal conductivity metal substantially the same size as the circuit component. At least a pair of integral sides along opposite edges of the top are bent normal to the top and are not further apart than the outside of the electrical leads on the opposite sides of the circuit component for good thermal contact therewith. The depth of the inside of the box is greater than the height of the top of the component so that there is no contact between the top of the box and the top of the component. The top of the box over the component is heated sufficiently to melt solder on the electrical leads. The box and component can then be lifted together from the printed circuit board.

8 Claims, 4 Drawing Sheets

DESOLDERING AID AND METHOD

BACKGROUND OF THE INVENTION

Printed circuit boards with electronic components mounted on the boards are ubiquitous in modern electronic apparatus. Many of the functional components of electronic circuits are now packaged in certain standard configurations. An exemplary package contains a logic or memory chip of semi-conductor material encapsulated to protect it from the environment. Such electronic circuit components very often have electrical leads protruding from the sides. These leads protrude laterally a short distance and then turn downwardly toward the face of the component to be mounted adjacent to the printed circuit board or the like. In some circuit components the leads extend straight beyond the bottom face of the component and are inserted through holes in a printed circuit board. The leads are then soldered in place in the holes. Other components referred to as surface mounted devices have the electrical leads soldered to a conductive lines printed on the printed circuit board. Some of these leads, referred to as J leads, curl underneath the component. Other surface mounted components have leads that extend straight down to a butt joint against a line on the board. Still others have leads, referred to as gull wing, which extend beyond the lower surface of the component and then laterally to lie atop lines on the board. Some devices, known as leadless chip carriers, have grooves in the sides of the package with conductive metal filling the grooves. The metal extends far enough beneath the package to be solderable on a printed circuit board.

Although many different packages have been adopted by the electronics industry there are a lesser number of standard sizes and shapes which have been adopted by common consent for uniformity in manufacturing operations. Some of these electronic components have a row of electrical leads on each of two opposite faces of the rectangular package. This is satisfactory where about 16 to 20 electrical leads are sufficient to convey signals between the printed circuit board and the chips in the package. However, as the complexity of chips has increased, larger numbers of electrical leads have been required. It is now common to find rows of leads on all four sides of a rectangular electronic component package. For example, one such rectangular package has a total of 68 electrical leads in four rows of 17 along each of its four sides. Another has 40 leads along each side of a square package. Packages with as many as 172 leads in four rows of 43 are also in use.

Manufacturing or assembly techniques have been developed for soldering such electronic components onto printed circuit boards, whether they have through-hole connections or are surface mounted devices. It sometimes happens, however, that electronic components fail, or it is desired to salvage components from an obsolete printed circuit board. It may be desirable to remove components from a printed circuit board in order to upgrade the circuitry. A number of circumstances may make it desirable to "desolder" circuit components from a printed circuit board or the like. Quite often it is just one of a number of components that is to be removed.

Desoldering of components with electrical leads that extend through holes in the printed circuit board can often be done with little difficulty since heating from the reverse of the board can be used to melt the solder so that component can be lifted from the board. Appreciably more difficulty may be encountered when trying to desolder surface mounted components. Heat must ordinarily be applied by way of the electrical leads rather than by way of the printed circuit board. To remove the component the separate solder joints for all of the electrical leads must be heated above the melting point of the solder so that the component can be lifted from the board without damage. If the joint for just one lead is left unmelted when the device is lifted from the board, there may be damage. It is commonly important that the "footprint" of the component on the board be left clean and reusable with minimal restoration for reuse. Heating must ordinarily be rapid to avoid overheating of the electronic component or adjacent circuit components remaining on the printed circuit board.

Further, it is often difficult to remove a single component from an array of components since modern packaging and high speed operation require that the circuit components be placed close together. This means that very little space is available for any of the instruments used for desoldering. Whatever is used for desoldering must ordinarily fit between adjacent components.

Special plier-like tools have been developed for bringing heated platens against the leads at the sides of circuit components. Such tools are held in place for a short time to permit heating and melting of the solder joints and then the component can be lifted with the special tool. These tools are somewhat costly and are therefore unsuited for operations where desoldering is only rarely required. Further, these devices are not well suited for larger sizes of components. The heating rates available are not adequate. Desoldering using commonly available soldering irons is nearly impossible since some joints freeze before others can be melted.

It is therefore, desirable to provide a technique for desoldering electronic components from printed circuit boards or the like using ordinary soldering irons, solder fountains or similar heat sources. The technique should be inexpensive for use when desoldering is only occasionally required, yet simple and rapid so that it can be adapted to repair stations where large numbers of components need to be removed.. It is desirable that it be usable with infrared or hot air heating since these lend themselves to automating the desoldering operation and reducing operator error. It is particularly important that damage to printed circuit boards be avoided.

BRIEF SUMMARY OF THE INVENTION

The technique provided in practice of this invention employs a desoldering aid that fits like a cap on a rectangular circuit component. The aid has a rectangular sheet of metal substantially the same size as the circuit component. At least a pair of integral extensions of the sheet along opposite edges are bent normal to the sheet and are not further apart than the outside of the electrical leads on the opposite sides of the circuit component.

If the component being desoldered is one with leads along all four sides, the aid takes the form of an open rectangular box. Preferably the depth of the inside of the box is greater than the height of the top of the component above the printed circuit board so that there is no contact between the top of the box and the top of the component. Such a box is placed over the electronic component with the opposite sides of the box in thermal contact with electrical leads along opposite sides of the component. The top of the box over the component is heated sufficiently to melt solder on the electrical leads. The box and component can then be lifted from the printed circuit board.

BRIEF DESCRIPTION OF THE DRAWINGS

These and other features and advantages of the present invention will be appreciated as the same becomes better understood by reference to the following detailed description when considered in connection with the accompanying drawings, wherein.

DETAILED DESCRIPTION

Figure 1:
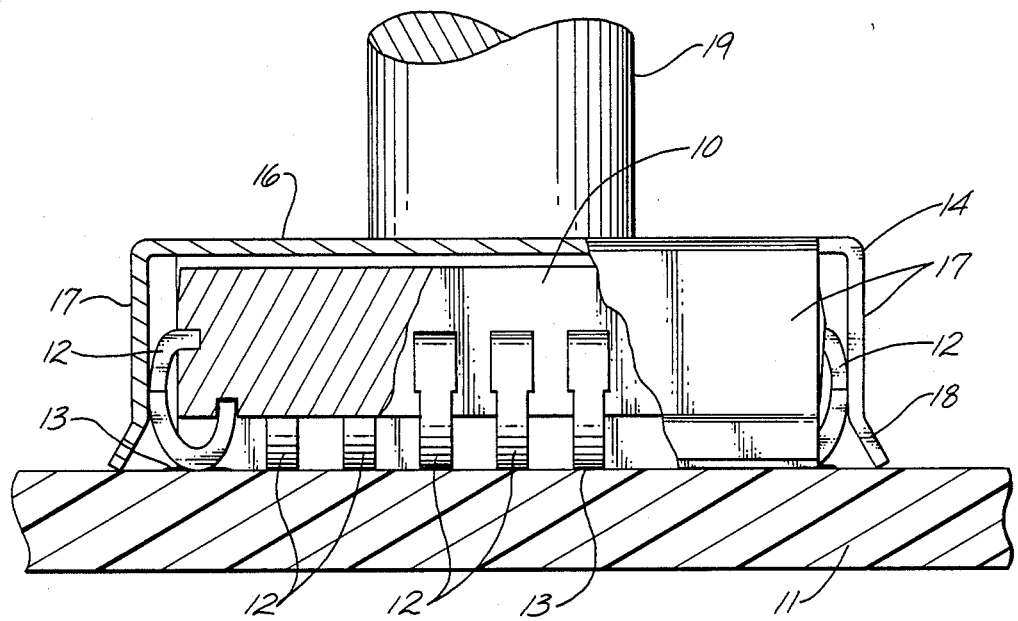
FIG. 1 is a side view partially in cross section of a desoldering aid on the circuit component in preparation for desoldering.

FIG. 1 is a side view illustrating an exemplary surface mounted circuit component 10 soldered onto a printed circuit board 11. Along each side of the circuit component there is a row of J-type electrical leads 12. Each lead protrudes laterally from the side of the circuit component a short distance and then curls underneath the component. The bottom of each of the leads is connected to a conductive metal line (not shown) on the printed circuit board by a solder joint 13. It will be recognized that the circuit component illustrated in FIG. 1 is merely exemplary and there are a broad variety of standard size circuit components for which this invention is applicable. It will also be recognized that although a surface mounted circuit component is described and illustrated, the technique set forth herein is also applicable to circuit components where the electrical leads are soldered in holes through the printed circuit board.

A rectangular metal box 14, illustrated in partial cross section, fits closely over the circuit component. The top 16 of the box has a small clearance from the top of the circuit component when the sides 17 of the box are pushed down against the printed circuit board. If desired insulation to provide a thermal barrier may be included inside the top of the box. The sides are integral with the rectangular top of the box and are bent down approximately normal to the top of the box. Along the bottom edge of each side of the box there is an outward flare 18 so that the inside width between opposite sides of the box along the open bottom is greater than the outside width between the electrical leads on opposite sides of the component. This facilitates placing the desoldering aid over the component. Other variations in shape of the sides may be used, such as an inward bulge to assure good thermal contact with the leads on a component.

The inside width of the box between its opposite sides is no greater than the outside width between the electrical leads on opposite sides of the component, and preferably the inside width of the box is smaller than the outside width of the electrical leads. This assures that the opposite sides of the box are in good thermal contact with the leads along both sides of the component. It is also desirable that, in addition to providing good thermal contact, the opposite sides of the box exert sufficient force against the electrical leads to support the weight of the component.

When the box has been placed on the component as illustrated in FIG. 1, the top of the box can be heated by a conventional electric soldering iron tip 19 or the like. Heat from the soldering iron is conducted from the top of the box down the sides to the electrical leads and hence to the solder joints connecting the electrical leads to the printed circuit board. The top of the box is heated sufficiently to melt the solder joints. The box can then be lifted and because of the close contact between the sides of the box and the electrical leads, the component is also lifted from the printed circuit board.

It is desirable that the desoldering aid be formed of high thermal conductivity metal. It will be recognized that the thermal conductivity is not only a function of the physical properties of the metal, but also of its thickness. By high thermal conductivity it is meant that sufficient heat can be conducted to the electrical leads from the top of the desoldering aid to melt the solder joints before there is excessive overheating of the circuit component. In an exemplary) embodiment a desoldering aid has inside dimensions of 0.32 inch by 0.46 inch (8.1 by 11.7 mm). In such an embodiment brass only 10 mils (250 microns) thick provides sufficient thermal conductivity for desoldering electronic components. Clearly appreciable variation from these dimensions may be employed with brass or other relatively high conductivity metals. Larger desoldering aids for larger components may require greater thicknesses of metal to conduct sufficient heat to the leads in a short time. Other metals that are satisfactory for practice of this invention include copper, beryllium copper, phosphor bronze, aluminum bronze and the like. In the event it is important to avoid wetting of the box by solder, some stainless steels or aluminum alloys may be used.

On the other hand it may be desirable to assure wetting of the desoldering aid. In such an embodiment the surface of the metal forming the desoldering aid may be preliminarily wetted or plated with tin, solder or other aid to wetting. Wetting of the desoldering aid can enhance thermal contact with the leads and expedite desoldering. The inside of the aid may be plated with tin, for example, to enhance contact with the leads; the outside may be plated to enhance thermal contact with the soldering iron; or both inside and out may be plated. Placing soldering flux in the box may also enhance thermal contact with the electrical leads. Matte plating the outside of the desoldering aid with tin or the like may provide a good indication of melting since the molten metal will become smooth and shiny.

In the embodiment just described and illustrated the top of the desoldering aid was heated by an electric soldering iron or the like. Other heating techniques may be employed as desired. For example, a focused infrared source may impinge infrared radiation on the top of the box at a sufficient rate to elevate its temperature and melt the solder joints. Such heating can facilitate lifting of the desoldering aid and circuit component with tweezers. Hot air or the flame rom a torch may provide adequate heating rates as well. Alternatively, the circuit board may be inverted and the top of the desoldering aid heated by a solder fountain, in which case the component may fall off or be shaken off the board. Infrared heating of an inverted board is also desirable for gravity removal of a component.

Figure 2:
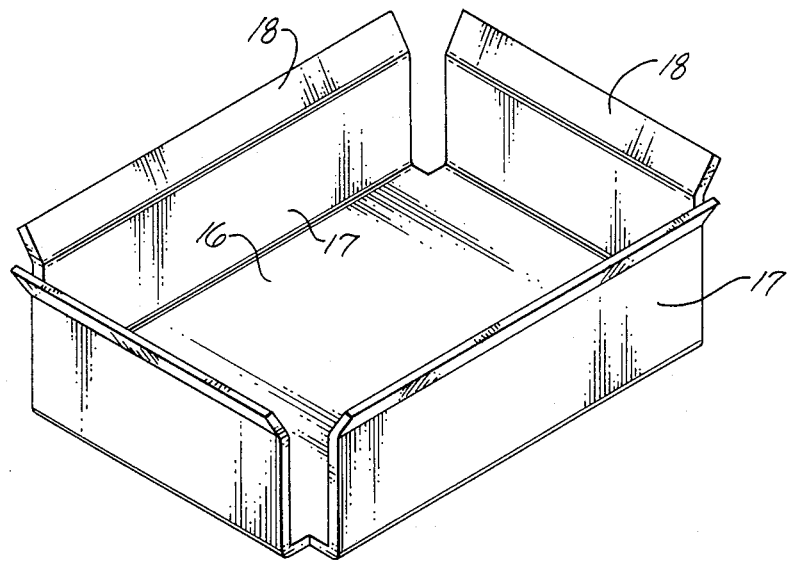
FIG. 2 is an axonometric view of a desoldering aid inverted.

The desoldering aid described and illustrated in FIGS. 1 and 2 is in the form of a box having four sides and a top. Such an aid is useful for desoldering circuit components having electrical leads on all four sides. In the event such a desoldering aid is used for a DIP circuit component having rows of electrical leads along only two opposite sides, it will be apparent that two of the sides of the box serve little useful function. Those sides may be deleted so that the desoldering aid is in the form of a U-shaped saddle that can be placed over a circuit component with two opposite sides in contact with the two rows of electrical leads.

Figure 3:
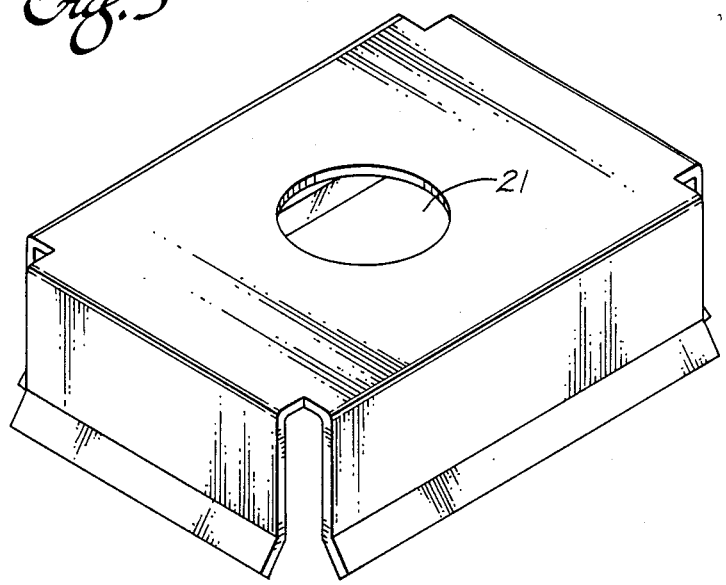
FIG. 3 is an axonometric view of another embodiment of desoldering aid.

FIG. 3 illustrates another embodiment of desoldering aid constructed according to principles of this invention. In this embodiment the top and four sides of the desoldering aid are substantially the same as hereinabove described. One or more holes 21 are provided through the top of the desoldering aid, however. Such a hole facilitates removing a desoldered component from the interior of the desoldering aid.

Much of the time, however, the components themselves are not intended to be salvaged and the desoldering aids are so cheap that they are simply discarded with the component. Even if the component is removed, the desoldering aid may be economically discarded to avoid loss of good thermal contact with leads in subsequent usage.

Figure 4:
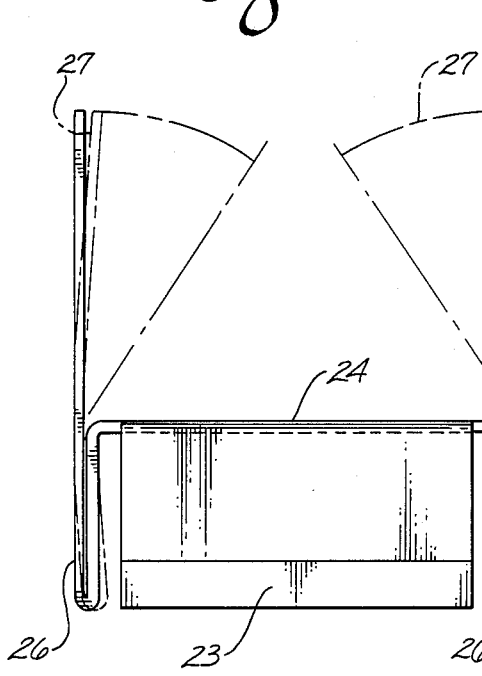
FIG. 4 is a side cross section of another embodiment of desoldering aid.
Figure 5:
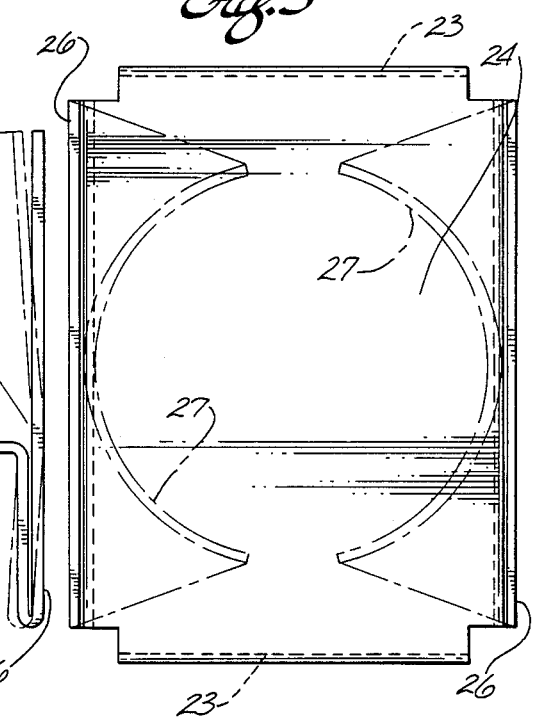
FIG. 5 is a top view of the desoldering aid of FIG. 4.

FIGS. 4 and 5 illustrate in side and top views respectively, another embodiment of desoldering aid constructed according to principles of this invention. As illustrated in this embodiment, the desoldering aid has two opposite sides 23 integral with the top 24, which are bent approximately normal to the top as hereinabove described. On the other two sides 26 the metal is bent downwardly in the same manner and at the bottom is doubled back upwardly so that these two opposite sides have double thickness. The bent back portion extends upwardly above the top as a pair of opposite facing upstanding wings 27. An upper portion of each wing is bent in a smooth transition to an approximately circular arc at its uppermost end. The upper ends of the two opposite wings can engage the sides of the tip (not shown) of a soldering iron.

To use the embodiment illustrated in FIGS. 4 and 5 the desoldering aid may be placed on the tip of a soldering iron and then placed on the electronic component as hereinabove described. As soon as the solder joints melt, the soldering iron can be lifted, thereby lifting the desoldering aid and circuit component from the printed circuit board. Alternatively the desoldering aid may be preliminarily placed on the component to be desoldered and then the soldering iron tip inserted between the opposing wings.

In this embodiment, the engagement of the desoldering aid and the soldering iron tip is essentially circular. It can also be desirable to have a non-round extension on the top of the desoldering aid. Components are sometimes adhesively bonded to the circuit board before the leads are soldered in place. To remove such a component, it may be necessary to twist the component in the plane of the board to break the adhesive joint. A non-round extension facilitates such twisting.

Figure 6:
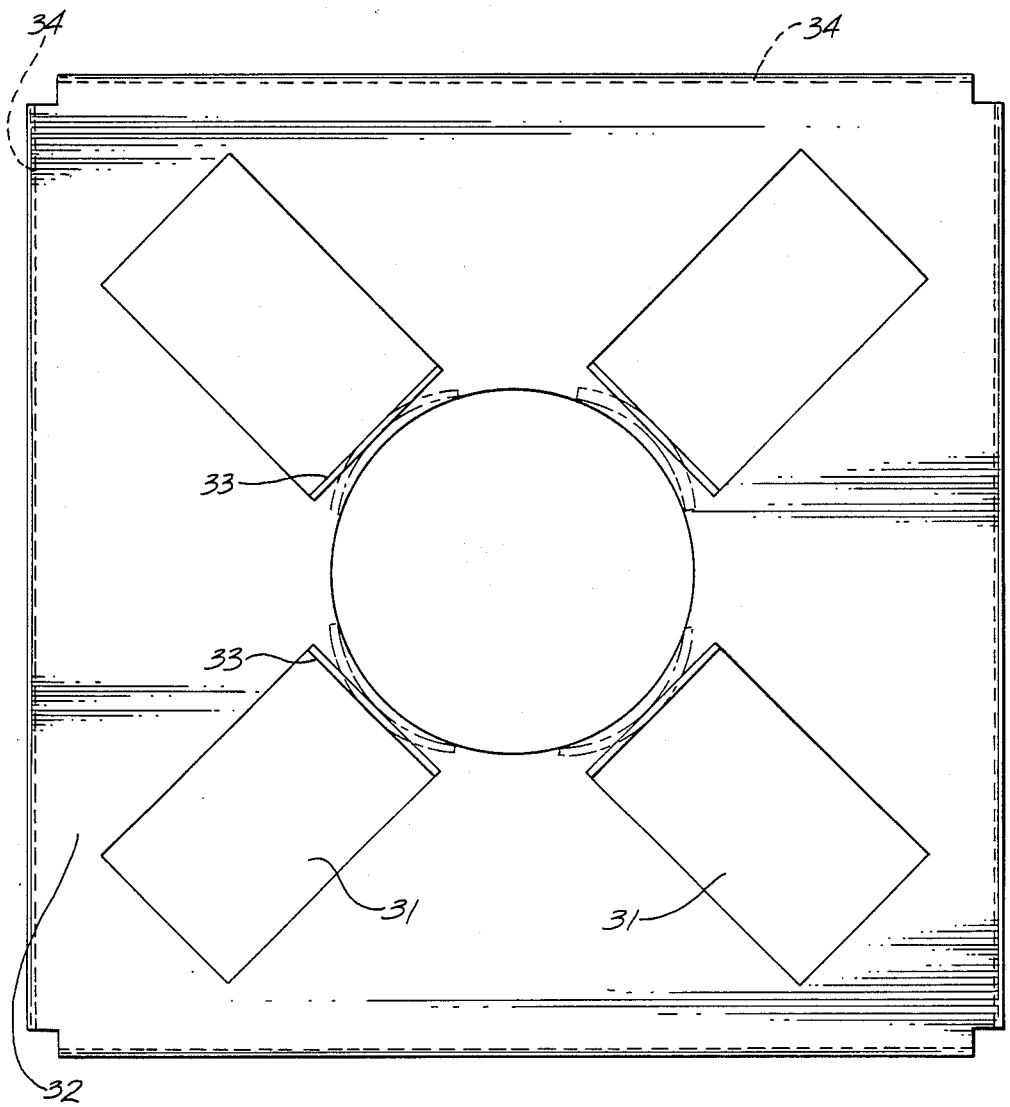
FIG. 6 is a top view of another embodiment of desoldering aid.

FIG. 6 illustrates another embodiment of desoldering aid which can be temporarily connected to a soldering iron tip for lifting a desoldered component from the printed circuit board. In this embodiment four slots 31 are cut in the top 32 of the desoldering aid. The resultant tabs 33 of metal are bent upwardly from the top in the opposite direction from the downward bend of the sides 34. These four tabs can engage the tip of the soldering iron in the same manner as the wings in the embodiment illustrated in FIG. 4 and 5. If desired, the tips of the wings can be bent into an arc of a circle for engaging the soldering iron tip, but that may not be necessary.

Figure 7:
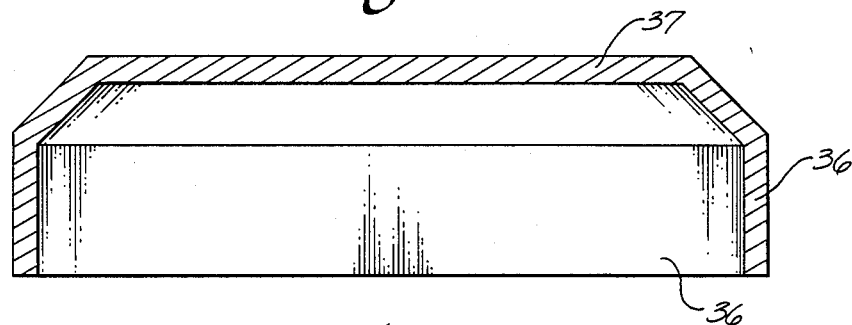
FIG. 7 is a side cross section of still another embodiment of desoldering aid.

The embodiments hereinabove described and illustrated are formed from flat sheet by stamping and bending with a suitable progressive die. Such a desoldering aid can be formed in a single stamping operation. FIG. 7 illustrates a variant where the desoldering aid is deep drawn instead of bent. In this embodiment, the sides 36 of the desoldering aid are integral with the top 37 and are connected together at the edges between the sides since drawn from a sheet. In an exemplary embodiment, such a desoldering aid 0.38 inch by 0.50 inch (9.7 by 12.7mm) can be fabricated from phosphor bronze having a thickness of 16 mils (400 microns). Another embodiment almost an inch square has been fabricated of copper sheet 10 mils (250 microns) thick.

In the embodiments starting with a cruciform sheet of metal with the sides bent from the top, the corners are deleted so that the adjacent sides do not interfere with each other. This permits a degree of springiness in the sides to conform to the electrical leads of the circuit component and provide some gripping action on the component for lifting it from the printed circuit board. Since a deep drawn desoldering aid as illustrated in FIG. 7 may not have sufficient springiness in the sides, a conventional desoldering braid may be used between the sides of the aid and the electrical leads on the circuit component. Alternatively, the vertical edges of such a deep drawn embodiment may be slit to enhance springiness of the sides.

Figure 8:
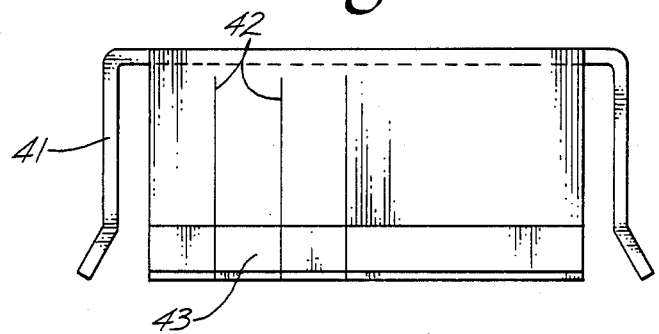
FIG. 8 is a side view of another embodiment of desoldering aid.

FIG. 8 illustrates another embodiment of desoldering aid essentially like the one illustrated in FIGS. 1 and 2 with one difference. In this embodiment each of the sides has a series of parallel slits 42 subdividing the side into a plurality of parallel fingers 43. The width of each finger is such that each finger contacts one of the electrical leads on the side of a standard size component. Such pectinate sides on the desoldering aid permit each finger to deflect as required to make close thermal contact with its respective electrical lead on the circuit component, regardless of variations of the electrical leads from planarity.

Figure 9:
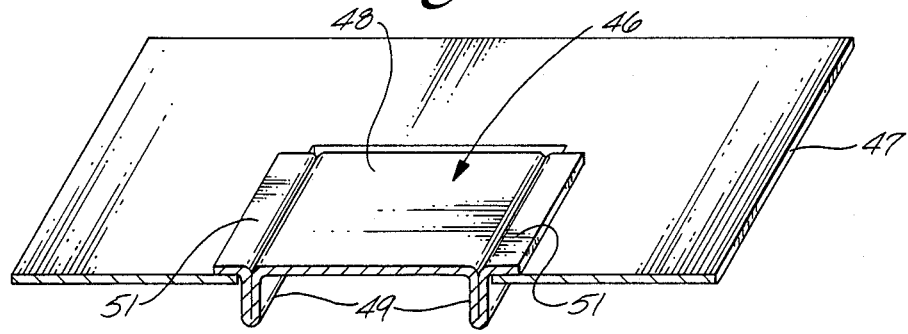
FIG. 9 is an axonometric view of half of an embodiment of desoldering aid with a heat shield.

FIG. 9 illustrates an embodiment of desoldering aid with a heat shield. In this drawing, half of the desoldering aid 46 and a surrounding heat shield 47 are illustrated, the other half being cut away to show the remaining half in section. The desoldering aid has a top 48 with opposite side edges 49 folded down approximately normal to the top. These side edges are then folded back up to have doubled thickness. At about the level of the top of the aid, the metal is again bent laterally outwardly to form small wings 51. In this embodiment other two side edges (one of which is hidden in this view and the other of which is cut away) are simply bent approximately normal to the top. If desired, they may also be formed with doubled thickness and wings, although this is not necessary. If this embodiment were used for Dual Inline Packages, only two opppsite edges are needed to contact the leads on the component and the hidden side may be deleted altogether.

The heat shield 47 has a rectangular hole in which the desoldering aid fits with a slight interference fit to hold the two parts together. The extensions or wings 51 on the conductive metal desoldering aid help position the heat shield near the top of the aid. The heat shield is made of reflective or shiny metal such as stainless steel, aluminum foil or the like. When the top 48 of the box is heated, such as with an infrared source, the heat shield prevents appreciable heating of the adjacent components. The differential heating of the box and shield can be accentuated by blackening the top of the box.

Figure 10:
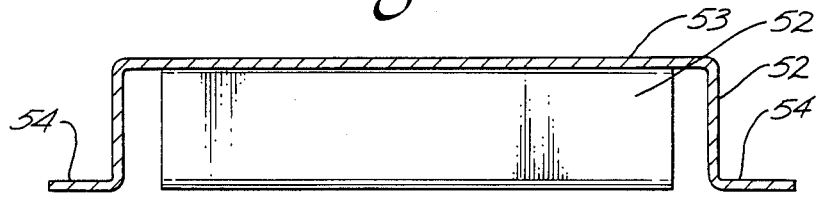
FIG. 10 is a side cross section of another embodiment of desoldering aid useful for desoldering gull wing leads.

FIG. 10 illustrates an embodiment of desoldering aid useful for desoldering gull wing leads. In this embodiment, the sides 52 are normal to the top 53, and the lower edges of each side is bent laterally outwardly to form an extension 54. When used, the extensions lie atop the gull wing leads and conduct heat to them to melt the underlying solder joint to the printed circuit board.

It is desirable to remove a circuit component from a printed circuit board in less than thirty seconds. Longer heating times may damage the components, or operators may become impatient and prematurely attempt to remove the component from the board, damaging the footprint of the component on the board. To expedite component removal, the circuit board may be heated from the opposite side. Most boards can be safely heated to 120° C. (250° F.). Brief heating of the desoldering aid may then be sufficient to melt the solder joints and remove the component.

The desoldering aid and component may be removed from the board by mechanical lifting or by gravity, as described. In an embodiment With a heat shield, removal may be aided by weighting the shield to provide a desired removal force. Ferromagnetic pieces may be provided on the desoldering aid, or it may be made of magnetic material for ready removal by magnetic force. Alternatively, vacuum may be used for lifting the desoldering aid and component.

Only one component on an otherwise sound printed circuit board may be defective. When that component is identified, a metal desoldering aid can be applied to it as a cap at the inspection station. The cap then serves as a marker of the defective component for later removal as well as an aid to removal.

Since several embodiments of desoldering aid constructed according to principles of this invention have been described and illustrated herein. It will be apparent to one skilled in the art that many other modifications and variations can be made in a desoldering aid within the scope of this invention. For example, small bumps or spurs may be formed on the inside of the desoldering aid to keep the top from contacting the top of a circuit component and overheating the component.

It will also be apparent that the desoldering aid is also useful for resoldering components on a printed circuit board. In that case, the component is positioned in the desoldering aid and placed on the board in the desired location. The top of the box is then heated to melt the solder and form a joint. A metal that is not wetted is used so that the aid can be removed from the soldered component. For components other than those with gull wing leads, resilient insulation such as a small wad of glass fiber, may be placed between the component and the top of the aid to assure that the component is pressed firmly against the board when the solder melts.

It is therefore to be understood that within the scope of the appended claims this invention may be practiced otherwise than is specifically described.

What is claimed is:

1. A desoldering aid for a standard size rectangular electronic circuit component having electrical leads protruding along sides of the component and soldered to a circuit board beneath the component comprising:
   a box of high thermal conductivity metal having a rectangular top, four rectangular sides approximately normal to the top and integral therewith, and no bottom;
   the inside width between opposite sides of the box being no greater than the outside width between electrical leads on opposite sides of the component so that the sides of the box contact the leads with at least sufficient force to support the weight of the component;
   the depth of the inside of the box being greater than the height of the top of the component above the circuit board so that there is no contact between the top of the box and the top of the component when the sides are against the circuit board; and
   a heat shield having a rectangular hole through which the sides of the box fit.

2. A desoldering aid for an electronic circuit component comprising:
   a rectangular metal conductor having a top and at least two opposite sides approximately normal to the top for conducting heat from the top through the sides to a component in the conductor; and
   a heat shield having a rectangular hole through which the sides of the conductor fit.

3. A desoldering aid as recited in claim 2 wherein there is an interference fit between the conductor and the heat shield.

4. A desoldering aid as recited in claim 2 wherein the conductor comprises wings for positioning the heat shield.

5. A desoldering aid for a standard size circuit component having electrical leads protruding from sides of the component comprising:
   a high thermal conductivity metal cap having sides no further apart than the outside distance between electrical leads on the component.

6. A desoldering aid as recited in claim 5 wherein the cap is rectangular and the four sides of the cap are not connected together at adjacent edges.

7. A desoldering aid as recited in claim 5 wherein the depth of the cap is greater than the height of the component.

8. A desoldering aid as recited in claim 5 comprising means for lifting the cap with a soldering iron tip.

* * * * *